TUNNEL-INJECTION LIGHT EMITTING DEVICES

Filed Sept. 9, 1963 3 Sheets-Sheet 1

INVENTOR.
RUSSELL V. HANKS
ALEXANDER MATTHEW UNWIN
BY
Reynolds & Christensen
ATTORNEYS INVENTOR.
RUSSEL V. HANKS
ALEXANDER MATTHEW UNWIN
BY
Reynolds & Christensen
ATTORNEYS

TUNNEL-INJECTION LIGHT EMITTING DEVICES

INVENTOR.
RUSSEL V. HANKS
ALEXANDER MATTHEW UNWIN

BY Reynolds & Christensen

ATTORNEYS

United States Patent Office 3,353,114

Patented Nov. 14, 1967

3,353,114

TUNNEL-INJECTION LIGHT EMITTING DEVICES

Russell V. Hanks, Seattle, and Alexander Matthew Unwin, Bellevue, Wash., assignors to The Boeing Company, Seattle, Wash., a corporation of Delaware Filed Sept. 9, 1963, Ser. No. 307,704
14 Claims. (Cl. 331—94.5)

ABSTRACT OF THE DISCLOSURE

Sandwich structures including a semiconductor body having a dielectric layer on one surface and appropriate parallel surfaces for laser action are disclosed. Carriers injected into the dielectric layer tunnel therethrough in response to an intense electric bias applied across the entire thickness of the structure so that the carriers will reach the light producing semiconductor body and recombine radiatively. Semiconductor as well as metal carrier injecting surfaces are disclosed as being secured to the surface of the dielectric layer opposite to the surface of the dielectric layer on which the light producing semiconductor body is located. A multi-sandwich high intensity laser is also disclosed as well as an embodiment making use of a magnetic field producing apparatus for establishing different energy states in the semiconductor.

This invention relates to a class of solid state devices which produce radiation commonly referred to as "electroluminescence." In one aspect the invention concerns production of electroluminescence in the visible and ultraviolet regions by means of a semiconductor laser. It further concerns a novel means for production of intense radiation of selectable wavelength within a range including the ultraviolet, visible and infrared regions and by a novel and compact, tunable means. The invention is herein illustratively described by reference to the presently preferred forms thereof; however, it will be recognized that certain modifications and changes therein may be employed without departing from the essential features involved.

The production of electroluminescence in solid state devices, normally those classed as semiconductors, is brought about as a result of the recombination of excited charge carriers. The introduction of these excited charge carriers may be achieved by their injection across a junction, which forms the basis for the light emitting diodes, both incoherent and coherent, known in the art. Another means of introducing the necessary excited carriers into a material (semiconductor) is by the use of the quantum mechanical process of tunneling. Such a scheme does not require the presence of a junction and is therefore applicable to a wider range of semiconductor materials. However, achievement of coherent radiation from semiconductors by laser (i.e. optical maser operating in the range including ultraviolet, visible and infrared regions) action is presently restricted to wavelengths longer than 6600 angstroms, and of coherent radiation from any laser type device, regardless of type, is presently limited to wavelengths longer than 5940 angstroms.

Presently known semiconductor laser structures of practical import all employ the junction injection scheme and as a consequence they are limited in the size of their optical cavities, hence in power productivity, and involve difficult fabrication problems. The result is undue restriction on power output, operating temperature and continuity of operation (i.e. duty cycle). Moreover, the cost of such devices is made high due to the high cull or rejection rate of production devices in order to obtain a given number of satisfactory ones with good optical cavities. A further shortcoming of junction type semiconductor lasers is the difficulty of producing them using thin film deposition techniques.

A prime objective of the present invention is to produce laser action at wavelengths in the visible and ultraviolet regions.

A second objective is to accomplish this in a semiconductor, thereby utilizing the many advantages offered by a semiconductor type laser in comparison with other lasers such as gas or solid non-semiconductor (e.g. ruby, etc.) lasers. Among these advantages are high modulation frequency capability, simple operating requirements and apparatus, and high efficiency.

A further purpose of the invention, which applies regardless of operating wavelengths, is to produce larger and more homogeneous, and more easily and more cheaply fabricated optical cavities in semiconductor lasers. In accordance with this invention, it is possible to reduce the cost and extend the operation of semiconductor laser devices generally, with respect to power, operating temperature, and duty cycle. Another purpose is to enable the use of semiconductors which have wide band gaps (i.e. visible to ultraviolet recombination radiation wavelength) and as a consequence do not readily lend themselves to forming junctions suitable for junction type lasers. These materials are desirable for laser applications because they exhibit an efficient and narrow linewidth recombination radiation characteristic, when excited by optical means, but have not been usable in junction lasers.

A further aim is to produce tunable semiconductor radiators, both coherent and incoherent, and which may be made to operate in any of the different portions of the spectrum including ultraviolet, visible and infrared regions.

A further object is to achieve this result in an efficient and simple manner, and one which permits the application of thin film techniques.

In all forms of the invention, radiation from the semiconductor is produced by incorporating it in a sandwich structure next to a dielectric layer through which carriers (electrons or holes) are tunneled for injection into the semiconductor material. In a first embodiment, a semiconductor wafer (the radiator) is prepared in a conventional manner to produce laser action, that is, in a rectangular parallelepiped, with two edge surfaces flat and relatively parallel, and the other exposed edge surfaces roughened in accordance with the established laser art. The wafer may be doped with or may contain centers suitable for recombination of the injected carriers of either type. Separated from the wafer by a thin dielectric barrier of a thickness less than or equal to 100 angstroms, is a semiconductor (injector) in which ionizing radiation (i.e. from an external radiation—optical pumping—source) produces carriers. These carriers are acted upon in the vicinity of the dielectric barrier by an electrical bias applied across the entire thickness of the sandwich structure in the (suitable) direction necessary for tunneling of the carriers through this barrier into the wafer semiconductor. They thus arrive by this means in the light-producing semiconductor wafer where they recombine radiatively, giving rise to emission of the desired radiation.

In a second embodiment, the carriers which tunnel through the dielectric into the semiconductor (radiator) are available in a metal (injector) layer which replaces the irradiated semiconductor (injector) layer of the sandwich in the first embodiment, thereby presenting a plentiful supply of carriers without requiring any auxiliary means for their creation.

In both embodiments laser action is enhanced by cooling the sandwich to produce line narrowing (i.e. less energy spread in the recombination radiation), and to reduce the number of phonons and the number of free carriers in the radiator, the presence of which causes absorption of the produced light. By reducing the quantity of phonons and free carriers in the semi-conductor (radiator) radiative emission exceeds radiative absorption, and there is a net gain of photons traversing the wafer leading to laser action. It is of course necessary that sufficient pumping power be applied (i.e. bias and/or radiation excitation, if used), consequently cooling the device has the collateral advantage of dissipating heat generation incidental to the pumping and permits the pumping power to be as high as necessary.

In both the first and second described embodiments the injected carriers arrive at a so-called "hot" corresponding to energies above the band edge) level in the semiconductor, from which they may either recombine directly or relax to their respective band edge level (corresponding to a "cooled" state).

A characterizing feature of the first embodiment is that the tunneling barrier inhibits carrier injection. It is further characterized by the use of a narrow bandwidth light source or other auxiliary pumping means to control injection rate, and by the fact that unwanted tunneling is avoided by the placement of the forbidden energy states of the emitting semiconductor (radiator) opposite the band in the injector containing the unwanted carriers. The first embodiment also makes readily feasible directly converting low energy, long wavelength radiation into higher-energy short wavelength radiation.

In both embodiments, it is readily feasible to control radiation wavelength (or energy) by direct bias manipulation (i.e. tunability). This results from the fact that use may be made of the hot carrier states for radiation producing transitions. In a broad aspect this tunability feature is useful in radiation producing systems of the disclosed types whether or not the semiconductor radiator is specifically prepared for laser action.

In a third embodiment a magnetic field is passed through the sandwich structure preferably in the direction parallel to the layers. This field produces different energy states in the semiconductor such that carriers tunneling into these energy states may undergo a selected change of energy less than in the preceding embodiments in order to produce longer wavelength radiations. Reference is made in this regard to the so-called cyclotron resonance transistion between adjacent magnetic levels. By varying either or both the magnetic and electric field intensity the device may be tuned.

These and other aspects of the invention will become more fully evident from the following description by reference to the accompanying drawings.

While various semiconductor, dielectric and metal materials can be used in carrying out the invention, reference will be made for purpose of illustration to specific materials as an aid in discussing and teaching the inventive concepts.

Figure 1:
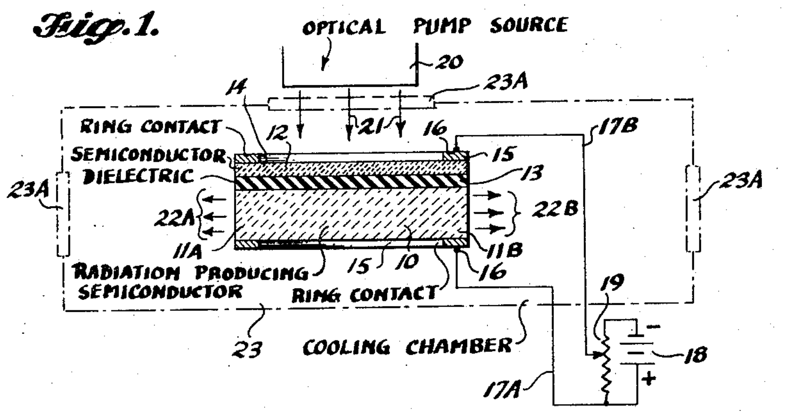
FIGURE 1 is a schematic diagram of the first embodiment of the invention, in which the sandwich structure is shown in cross section taken in a plane perpendicular to the plane of the semiconductor (radiator) wafer, and in which an external light source creates the carriers which are to be tunneled.

In FIGURE 1, the semiconductor wafer in which laser action is produced is designated 10. It has a rectangular parallelepiped configuration and, for example, is monocrystalline silicon doped to near degeneracy at liquid helium temperature with p-type impurities (e.g. boron). Ends 11A and 11B are cleaved or polished to a high degree of flatness (one-tenth wavelength) and parallelism (6 seconds of arc) and the various other surfaces are roughened with the exception of the surface at 12. This surface is cleaved under vacuum or polished very flat (one-tenth wavelength). In order to form a sufficiently thin dielectric layer 13 on this surface, the surface is oxidized to a layer thickness 25 to 50 angstroms. Other methods of providing a thin dielectric layer are also readily available, one other being described in conjunction with FIGURE 2. In this example, a third or optical absorbing layer 14 of the sandwich is produced by depositing germanium over the oxide to a thickness of 1 to 10 microns while the materials remain in the vacuum. Intrinsic germanium is used for this deposition. Square-ring electrodes 15 of aluminum are then deposited on the front and back surfaces, and contacts 16 of indium are provided to attach the gold wires 17A and 17B.

An external bias is applied from a battery 18 and, in order to tune the radiation source to the desired wavelength, a means is provided for variation of the bias, namely potentiometer 19. The illustrated auxiliary optical pump source 20 is intended to represent a giant pulse operated ruby laser with an output of 0.1 to 1.0 joules per 30 nanosecond duration pulse. Other optical pumping sources of known types may be used to the same end.

In operation, radiation 21 at 6943 angstroms from source 20 is absorbed by the germanium layer 14, and thereby creates the electrons for tunneling. At a suitable bias, in the range from 0.5 to 5.0 volts, these tunneling electrons thus injected through dielectric layer 12 into the semiconductor wafer 10 produce in the latter recombination radiation in the visible to ultraviolet region of the spectrum. This recombination radiation forms the basis for the laser action and is emitted in the direction shown at 22A and 22B. Finally the entire structure is incorporated in a refrigerated enclosure or cooling chamber shown schematically by the broken line 23, such that the sandwich structure is subjected to a very low temperature, such as that of liquid helium. Windows 23A are provided in the walls of this enclosure to admit the pumping radiation and to allow the emitted radiation to escape for utilization. A typical arrangement consists of a sandwich 1 cm. by 1 cm. area and approximately 0.2 mm. thickness refrigerated to temperatures near that of liquid helium 4.2° K.).

Figure 2:
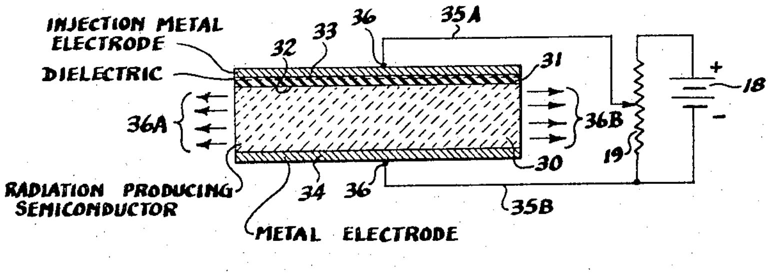
FIGURE 2 is a similar view of the second embodiment, in which a metal is used as the source of the carriers to be injected (injector); the refrigerated enclosure being omitted for convenience of illustration.

The generation of the carriers required for tunneling is also possible by making use of a metal as the injector. In FIGURE 2 an arrangement for obtaining laser action in such a device is shown. The semiconductor wafer 30 as before is a monocrystal, in this example of undoped cadmium sulfide (conductivity approximately 30 ohm-cm. at liquid nitrogen temperature 77° K.). A thin layer 31 of aluminum (100 angstroms thick) is deposited on the freshly cleaved surface 32 of the cadmium sulfide, and allowed to oxidize to about 50 angstroms layer depth, and is then covered by a 1000 angstrom film 33 of gold. A thickness of aluminum remains between the semiconductor 30 and the dielectric layer 31, but this is not considered an operating "layer" and its presence is, of course, merely incidental to formation of the dielectric. An indium electrode film 34 is placed on the opposite side of the cadmium sulfide wafer. Gold wires 35A and 35B are attached to the gold and indium layers by means of indium solder for applying the variable bias as in the previous case. In other respects the device shown in FIGURE 2 is made similar to that of FIGURE 1. Coherent radiation is emitted as shown at 36A and 36B. A refrigerated enclosure (not shown) permits operation at low (e.g. liquid helium) temperature.

In both embodiments the wafer may be in the form of a film with the polished end walls of the wafer replaced by separate reflectors of the type known in laser technology.

Concerning the design requirements for the first embodiment, semiconductor layer 14 may be of any semiconductor material having an absorption coefficient for the pump source wavelength of the order of or greater than $10^5$ cm.$^{-1}$ and having a thickness such that the attenuation of ionizing radiation is of the order of $10^{-8}$. Another requirement is that the lifetime of the carriers in the material be sufficient to allow their reaching the dielectric. The dielectric layer 13 should withstand a tunneling field or voltage gradient of order $10^6$ to $10^7$ volts per cm. and be free of shorting paths or "pinholes." Semiconductors 14 and 10 must be more highly conductive than the intervening insulator. It will be evident otherwise that the necessary operating conditions for the invention may be satisfied by a wide variety of materials, design parameters and physical operating conditions in accordance with knowledge common to the art. This is also true of the second embodiment. In this case, however, it is also necessary that the lower electrode 34 be an injecting contact (rather than a rectifying contact) for the opposite type of carrier to that being injected by tunneling—hence the use of indium for the contact 36 as a material which will work with a cadmium sulfide semiconductor.

Depending upon the type of semiconductor (P or N) used in the light emitting layer the polarity of applied voltage will be in one direction or the other. If it is of the P type the layer will be positive. If the semiconductor is intrinsic material (i.e. pure) bias polarity is not critical.

Figure 3:
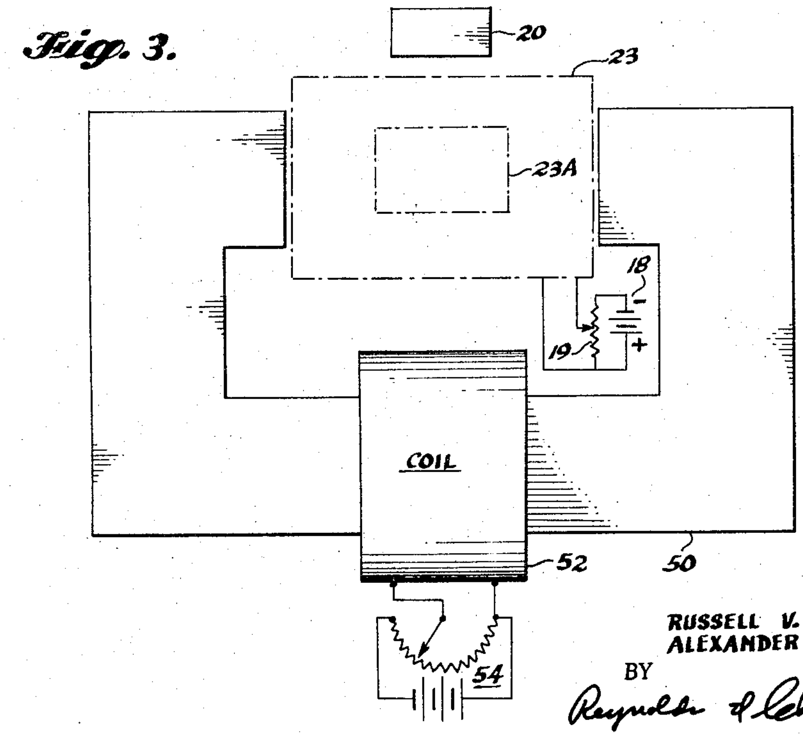
FIGURE 3 is a simplified end view of a device such as that shown in FIGURE 1, with a variable means added for the purpose of achieving the desired energy states in the third mentioned embodiment.

In FIGURE 3 an electromagnet 50 having a magnetizing coil 52 energized by a variable voltage source 54 creates a magnetic field in the sandwich structure (i.e. particularly in the radiation emitting layer) directed parallel to the layers. Such a field creates the different energy states previously alluded to and provides a means by which relatively small energy transitions may be achieved so as to generate infrared wavelength radiation in the semiconductor. Wavelength may be varied, therefore, either by varying this magnetic field intensity or by varying the electric field intensity (by potentiometer 19), or both. Because both may be varied, if desired, the device may be used as a multiplier, among its various applications.

Figure 4:
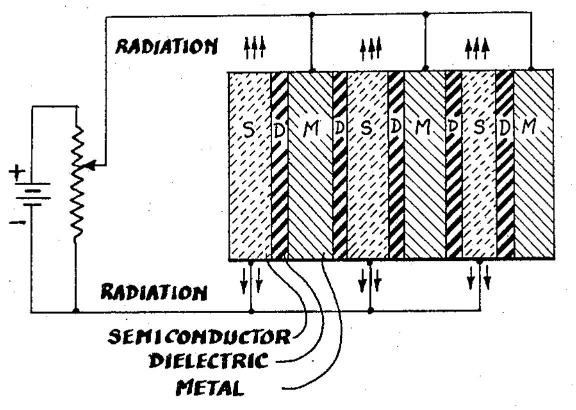
FIGURE 4 is a schematic of a composite (i.e. multi-sandwich light) source employing the invention.

A further and useful feature of the invention is depicted in FIGURE 4. A compact and powerful radiation source is achieved by combining or stacking a plurality of sandwich structures (usually of laser form), each appropriately energized. In stacked units of the type represented by the second embodiment two successively adjacent units may share in common either a metal layer or a semiconductor layer, whereas one of these units and a different unit next succeeding it in the stack share the other layer, as shown in FIGURE 4. With stacked sandwich structure units of the first embodiment, successively adjacent pairs of units may share a semiconductor layer (alternately as the carrier source and as the light producing medium). In either case multiple functioning (i.e. sharing) of common layers further enhances compactness of the composite source.

The invention has a wide variety of applications. In addition to the usual applications for lasers or light sources generally, embodiments thereof may be used, for example, as an optical F-M source, as a tunable radiation source for heterodyning or as a pump source for lasers, as an optical amplifier for the infrared to ultraviolet regions, etc.

Figure 5:
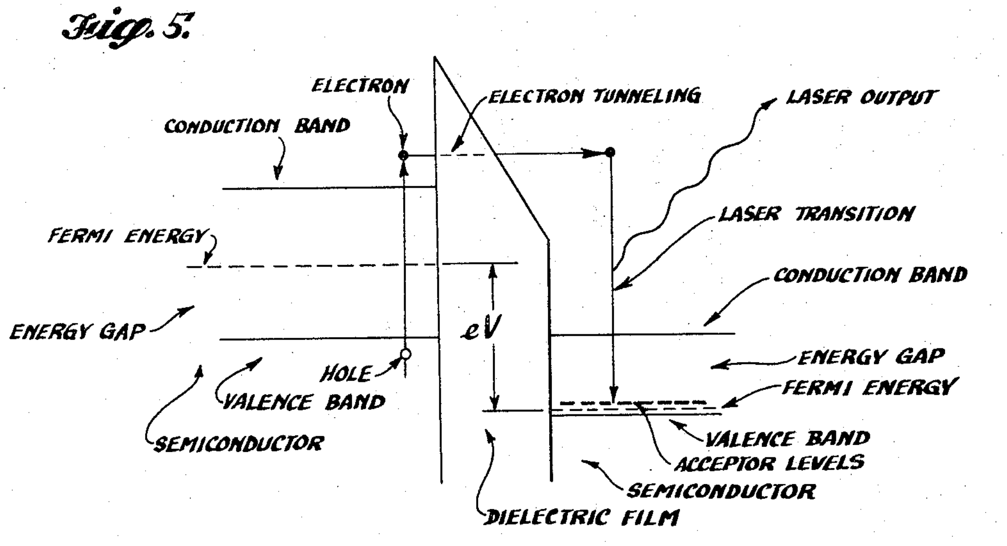
FIGURE 5 is an energy level diagram for the device illustrated in FIGURE 1.

The theory of the functioning of the device illustrated in FIGURE 1 (for the special case of electron injection) is as follows. An inverted population of energetic electrons is built up by a radiation controlled tunneling process, as depicted schematically in FIGURE 5, where the energy structure for a typical tunneling arrangement (assuming electron acceptor recombination) is shown. As is well known this absorption results in an enhancement of the probability of tunneling. Also, because of the relatively lower energy of valence band electrons and because of the relative positioning of the semiconductor band gaps, valence band tunneling will not be significant under the conditions of intense illumination to be used in the pumping process.

The injected carriers are now "hot" (i.e. have a high kinetic energy) with respect to the second semiconductor since their energies will generally lie an electron volt or so above the conduction band edge. The energy of the resultant recombination radiation is then a function of the bias voltage, V, that is applied, and that is referred to in the figure.

An alternative mode of operation is to allow the hot electrons to relax to the conduction band edge before recombining.

Figure 6:
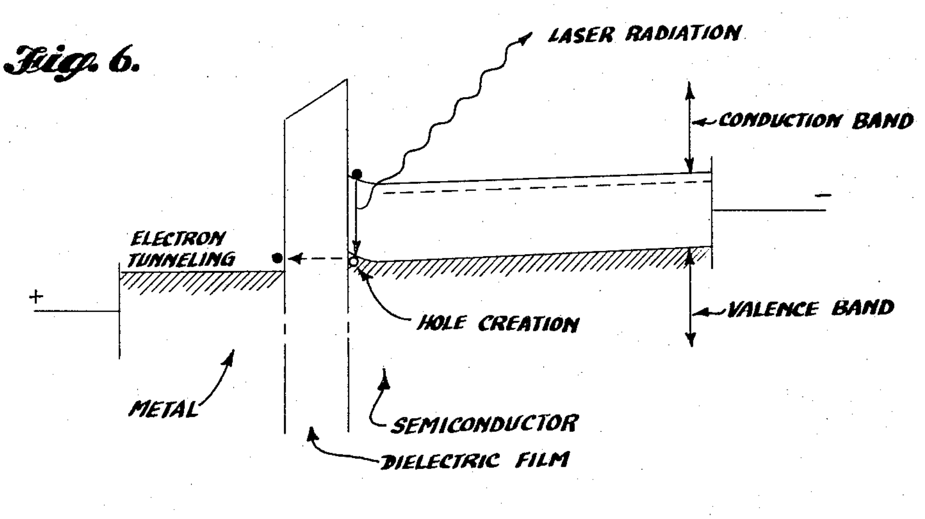
FIGURE 6 is an energy level diagram for the device illustrated in FIGURE 2.

FIGURE 6 depicts the energy structure for the tunneling arrangement of FIGURE 2.

A metal-insulator-semiconductor structure is shown, and a bias is represented making the metal positive with respect to the semiconductor. This permits electrons to tunnel from the valence band of the semiconductor to unoccupied states in the metal, creating holes in the semiconductor suitable for the production of electroluminescence. By use of sufficiently large current densities, this region of electroluminescence is made to have a negative absorption coefficient in sufficient excess of the positive absorption coefficient representative of the losses in the cavity (transmission, diffraction) to create amplification of the stimulated emission, i.e. laser action.

The same basic structure may in principle be used under the opposite polarity conditions to inject electrons from the metal into the conduction band of the semiconductor.

Figure 7:
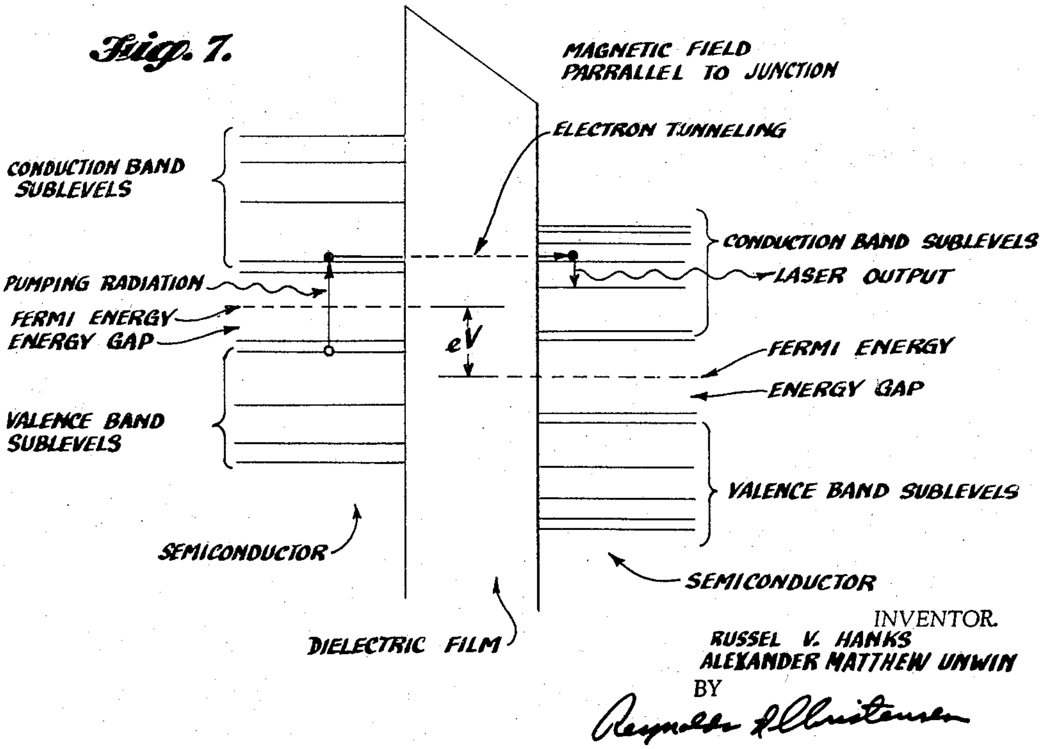
FIGURE 7 is an energy level diagram for the device illustrated in FIGURE 3.

FIGURE 7 depicts the energy structure relevant to the magnetic tunneling scheme of FIGURE 3. The description is basically the same as that for FIGURE 5, except that the presence of a magnetic field create the sublevels within the bands as shown. The laser output is then the result of creating a population inversion between adjacent sublevels, as indicated. The applied bias, V, is indicated in the figure.

It should be understood that the material selected for the laser has the necessary divergence of magnetic energy levels, since it is desirable that there be a unique transition.

We claim as our invention:

1. A laser comprising a sandwich structure including a first layer of semiconductor material, a second layer of dielectric material of a thickness less than 100 angstrom units next to the first layer, and a third layer as a source of current carriers next to the second layer; means for injecting current carriers from the third layer into the first layer by tunneling, including a voltage source having opposing terminals connected to the exposed faces of the first and third layers, said laser further including two reflective plane parallel surfaces disposed transverse to the layers, with the first layer lying therebetween and disposed perpendicular thereto, the value of source voltage and the available quantity of tunneling carriers from the third layer being sufficiently great to produce laser action.

2. The laser defined in claim 1, wherein the first layer comprises a wafer of semiconductor material two opposite edge faces of which comprise the reflective surfaces.

3. The laser defined in claim 1, wherein the means for injecting the tunneling carriers further comprises a separate source of radiation disposed to impinge upon the third layer, said third layer comprising a semiconductor operable thereby to emit carriers which tunnel through the second layer into the first layer.

4. The laser defined in claim 1, wherein the third layer comprises a conductive material.

5. A tunable laser comprising a sandwich structure including a first layer of semiconductor material, a second layer of dielectric material of a thickness less than 100 angstrom units next to the first layer, and a third layer as a source of charge carriers next to the second layer, means for injecting charge carriers from the third layer into the first layer by tunneling, including a voltage source having opposing terminals connected ot the exposed faces of the first and third layers, said sandwich structure further including two reflective plane parallel surfaces disposed transverse to the layers, with the first layer lying therebetween and disposed perpendicular thereto, the value of source voltage and the available quantity of tunneling carriers from the third layer being sufficiently great to produce laser action, and means to vary the voltage of said voltage source, thereby to tune said light source.

6. The laser defined in claim 5, wherein the means for injecting the tunneling carriers further comprises a separate source of radiation disposed to impinge upon the third layer, said third layer comprising a semiconductor operable thereby to emit carriers which tunnel through the second layer into the first layer.

7. The laser defined in claim 5, wherein the third layer comprises a conductive material.

8. A light source comprising a stack of sandwich structures each comprising a first layer of semiconductor material, a second layer of dielectric material of a thickness less than 100 angstrom units next to the first layer, and a third layer as a source of current carriers next to the second layer, means operatively associated with each sandwich structure for injecting current carriers from the third layer into the first layer by tunneling, including a voltage source having opposing terminals connected to exposed faces of the first and third layers, the first layer of two successively adjacent sandwich structures being a single layer common to both, said light source further including two reflective plane parallel surfaces disposed transverse to said first layer with said first layer lying therebetween and disposed perpendicular thereto.

9. A light source comprising a stack of sandwich structures each comprising a first layer of semiconductor material, a second layer of dielectric material of a thickness less than 100 angstrom units next to the first layer, and a third layer as a source of current carriers next to the second layer, means operatively associated with each sandwich structure for injecting current carriers from the third layer into the first layer by tunneling, including a voltage source having opposing terminals connected to the exposed faces of the first and third layers, the third layer of two successively adjacent sandwich structures being a single layer common to both, said light source further including two reflective plane parallel surfaces disposed transverse to said first layer with said first layer lying therebetween and disposed perpendicular thereto.

10. A light source comprising a stack of sandwich structures each comprising a first layer of semiconductor material, a second layer of dielectric material of a thickness less than 100 angstrom units next to the first layer, and a third layer as a source of current carriers next to the second layer, means operatively associated with each sandwich structure for injecting current carriers from the third layer into the first layer by tunneling, including a voltage source having opposing terminals connected to the exposed faces of the first and third layers, the first layer of two successively adjacent sandwich structures being a single layer common to both and the third layer of one such latter sandwich structure and the next succeeding sandwich structure being a single layer common to both, said light source further including two reflective plane parallel surfaces disposed transverse to said first layer with said first layer lying therebetween and disposed perpendicular thereto.

11. A laser comprising a sandwich structure including a first layer of semiconductor material, a second layer of dielectric material of a thickness than 100 angstrom units next to the first layer, and a third layer as a source of current carriers next to the second layer, means for injecting current carriers from the third layer into the first layer by tunneling, including a voltage source having opposing terminals connected ot the exposed faces of the first and third layers, said laser further including two reflective plane parallel surfaces disposed transverse to the layers, with the first layer lying therebetween and disposed perpendicular thereto, the value of source voltage and the available quantity of tunneling carriers from the third layer being sufficiently great to produce laser action, and means of producing a magnetic field extending through the first layer in the general plane thereof.

12. The laser defined in claim 11, including means to vary the magnetic field intensity.

13. A tunable light source comprising a sandwich structure including a first layer of semiconductor material, a second layer of dielectric material of a thickness less than 100 angstrom units next to the first layer, and a third layer as a source of current carriers next to the second layer, means for injecting current carriers from the third layer into the first layer by tunneling, including a voltage source having opposing terminals connected to the exposed faces of the first and third layers, and means to vary the voltage of said voltage source, thereby to tune said light source, and means of producing a magnetic field extending through the first layer in the general plane thereof, said light source further including two reflective plane parallel surfaces disposed transverse to said first layer with said first layer lying therebetween and disposed perpendicular thereto.

14. The laser defined in claim 13, including means to vary the magnetic field independently of the voltage of said voltage source.

References Cited

UNITED STATES PATENTS

| | | | |
|---|---|---|---|
| 2,938,136 | 5/1960 | Fischer | 313—108 |
| 3,059,117 | 10/1962 | Boyle | 331—94.5 |
| 3,242,368 | 3/1966 | Donald | 313—108 |
| 3,245,002 | 4/1966 | Hall | 331—94.5 |

OTHER REFERENCES

Dill: "Light Emitting Device" IBM Tech. Disc. Bulletin, vol. 6, No. 2, July 1963, pp. 84–85.

Thomas: "Fluorescence in CdS" J. App. Phys., vol. 33, No. 11, pp. 3243–3249, November 1962.

Wang: "Direct Radiative Recombination" App. Phys. Letters, vol. 2, No. 8, Apr. 15, 1963, pp. 149–150.

JEWELL H. PEDERSEN, *Primary Examiner.*

E. S. BAUER, R. L. WIBERT, *Assistant Examiners.*